United States Patent [19]
Vermeer et al.

[11] Patent Number: 5,902,201
[45] Date of Patent: May 11, 1999

[54] POSITIONING DEVICE AND COMPONENT PLACEMENT MACHINE INCLUDING THE POSITIONING DEVICE

[75] Inventors: Adrianus J. P. M. Vermeer; Petrus A. De Bie, both of Eindhoven; Jeroen G. P. Cox, Waalre, all of Netherlands

[73] Assignee: U.S. Philips Corporation, New York, N.Y.

[21] Appl. No.: 08/806,874
[22] Filed: Feb. 25, 1997
[30] Foreign Application Priority Data
Mar. 14, 1996 [EP] European Pat. Off. .............. 96200710
[51] Int. Cl.⁶ ................................ F16H 7/08; F16H 7/24; F16H 27/02; F16D 1/00
[52] U.S. Cl. ........................ 474/109; 474/150; 474/255; 74/89.22; 403/229; 280/784
[58] Field of Search .................... 474/148, 150, 474/101, 102, 109, 253, 255; 403/28, 42, 57, 58, 68, 146, 166, 229; 74/89.2, 89.21, 89.22, 89.1, 110; 280/781, 784

[56] References Cited

U.S. PATENT DOCUMENTS

| | | | |
|---|---|---|---|
| 167,838 | 9/1875 | Isaacs ..................................... | 474/255 |
| 369,023 | 8/1887 | Newell .................................... | 474/255 |
| 4,284,192 | 8/1981 | Taylor .................................... | 474/109 |
| 4,781,666 | 11/1988 | Acee, Sr. ................................ | 474/255 |
| 5,106,345 | 4/1992 | Moore et al. ............................ | 474/253 |
| 5,381,706 | 1/1995 | Yanusko et al. ........................ | 474/253 |

FOREIGN PATENT DOCUMENTS

4404613  8/1995  Germany ........................... F16H 7/02

*Primary Examiner*—Charles A. Marmor
*Assistant Examiner*—Matthew A. Kaness
*Attorney, Agent, or Firm*—Anne E. Barschall

[57] ABSTRACT

The positioning device comprises a chassis (1) provided with a drive wheel (2), mounted on the shaft of a motor (6), and a reversing wheel (3). The positioning device further comprises a loop-shaped traction member (4) tensioned around the wheels (2, 3). The traction member (4) is connected to a load (5), which is movable relative to the chassis (1) and together with the traction member (4) forms a closed loop. The drive wheel (2) and the motor (6) form a drive means for driving the load (5) via a first section (41) of the traction member (4), which first section is disposed between the load (5) and the drive wheel (2), and via a second section (42) of the traction member (4), which second section is disposed between the load (5) and the drive wheel (2). The load (5) carries tensioning means (7) for tensioning the traction member (4). These tensioning means act on the first section (41) of the traction member (4) via a first point of engagement (A) and on the second section (42) of the traction member (4) via a second point of engagement (B). These tensioning means (7) keep the traction member (4) under tension. The load (5) is coupled to the traction member (4) via a coupling mechanism (8). The coupling mechanism (8) links a first relative movement of the first point of engagement (A) relative to the load to a second relative movement of the point of engagement (B) relative to the load in an opposite direction.

12 Claims, 5 Drawing Sheets

POSITIONING DEVICE AND COMPONENT PLACEMENT MACHINE INCLUDING THE POSITIONING DEVICE

The invention relates to a positioning device comprising a chassis provided with at least two wheels, a loop-shaped traction member tensioned around the wheels, a load connected to the traction member, which load is movable relative to the chassis and together with the traction member forms a closed loop, a drive means for driving the load via a first section of the traction member, which first section is disposed between the load and the drive means, and via a second section of the traction member, which second section is disposed between the load and the drive means, tensioning means, connected to the load, for tensioning the traction member, which tensioning means act on the first section of the traction member via a first point of engagement and on the second section of the traction member via a second point of engagement.

Such a positioning device is known from DE 44 04 613 A1. The known positioning device is a vertical lift by means of which a carrier can be positioned in a vertical direction via a toothed belt. The toothed belt engages with two wheels, one of the wheels being drivable. The toothed belt has a first section extending underneath the carrier and coupled to the carrier via tensioning means in the form of a spring. The toothed belt has a second section extending over the carrier and connected directly to the carrier. The total elongation in the traction member depends on the position of the carrier. This elongation is compensated for by means of said spring. A disadvantage of the known positioning device is that the tensioning forces prevailing in the toothed belt are comparatively large, as result of which the wear of the toothed belt and the wheel bearings is substantial.

It is an object of the invention to provide a positioning device of the type defined in the opening paragraph, in which the tensioning forces prevailing in the traction member are smaller than in the known system. To this end, the positioning device in accordance with the invention is characterized in that the connection between the load and the traction member includes a coupling mechanism, by means of which a first relative movement of the first point of engagement relative to the load in a first direction is linked to a second relative movement of the point of engagement relative to the load in a direction opposite to the first direction. In the known device the tension in the first section of the traction member is maintained substantially constant by the tensioning means. As a result of this, a force exerted on the load by the drive means can be transmitted only by varying the tension in the second section of the traction member. The tension in the traction member should then remain greater than zero, so that the pretension force to which the traction member is subjected should be at least equal to the force to be transmitted and the maximum tension in the traction member is at least twice as great as the force to be transmitted. Owing to the measures in accordance with the invention the traction member can be pre-tensioned at the location of the load, while a force exerted on the load by the drive means is still divided between the first section and the second section of the traction member. As a result of this, the pretension force acting on the traction member can be reduced and the maximum tension that occurs becomes smaller. Moreover, it appears that by means of the measures in accordance with the invention it becomes possible to optimize the stiffness of the connection between the drive means and the load in dependence upon the use. Pretensioning at the location of the load using the measures in accordance with the invention also has the advantage that a position of the load relative to the chassis is obtained which is independent of length variations of the traction member. These length variations occur, for example, as a result of expansion and contraction of the traction member caused by temperature variations. Particularly, if the traction member is made of a plastic material these length variations may affect the accuracy of the positioning system. By selecting a suitable transmission ratio between the first and the second relative movement said position can be centered in the range to be covered, as a result of which the influence of length variations of the traction member on the positioning accuracy is minimized.

An embodiment of the positioning device in accordance with the invention is characterized in that the coupling mechanism has a transmission ratio i between the first relative movement and the second relative movement between 0.5 and 2. It has been found that this measure reduces the maximum tension that occurs to two thirds of the maximum tension that occurs in the known device.

An embodiment of the positioning device in accordance with the invention is characterized in that $0.8 < i < 1.25$. It has been found that this measure reduces the maximum tension even further to 55% of the maximum tension that occurs in the known device.

An embodiment of the positioning device in accordance with the invention is characterized in that the tensioning means have an effective first stiffness with respect to the points of engagement and the traction member has a second stiffness between the points of engagement, and the second stiffness is not more than one tenth of the first stiffness. A comparatively low effective stiffness of the tensioning means has the advantage that the pretension force in the traction member hardly varies owing to a movement of the first and the second point of engagement relative to one another. As a result, for example, temperature variations have little influence on the pretension force. Moreover, this makes the pretension force immune to production tolerances which inevitably occur during assembly of such a positioning device. In the known positioning device a comparatively low effective stiffness of the tensioning means results in a comparatively low stiffness of the connection between the drive means and the load, whereas in the positioning device in accordance with the invention the stiffness of the connection is hardly affected by the stiffness of the tensioning means. Besides, it has been found that as a result of this measure the stiffness of the connection between the drive means and the load is substantially independent of the position of the load relative to the drive means if $0.8 < i < 1.25$. Owing to this, the natural frequency, which is determined by the mass of the load and the stiffness of the connection, is substantially constant, which enables the behavior of the positioning device to be predicted better and which reduces the likelihood that this natural frequency coincides with another resonant frequency in the positioning device. Such a coincidence of natural frequencies may give rise to resonances of the load and, as a consequence, to an inaccurate positioning.

An embodiment of the positioning device in accordance with the invention is characterized in that the second stiffness is not greater than one hundredth of the first stiffness. Owing to this step the pretension force is maintained constant even better while the stiffness of the connection remains comparatively high. Preferably, the second stiffness is even zero. This can be achieved, for example, by means of a piston in a compression cylinder which is maintained at a constant pressure.

An embodiment of the positioning device in accordance with the invention is characterized in that the coupling mechanism comprises a lever having a first arm coupled to the first point of engagement and having second arm coupled to the second point of engagement, and the pivot of the lever is coupled to the load. In this way, the coupling mechanism is implemented by very simple means while, in addition, the ratio between the first and the second relative movement can be adjusted simply by an appropriate selection of the location of the pivot relative to the points of engagement.

An embodiment of the positioning device in accordance with the invention is characterized in that the coupling mechanism comprises a first lever having a first arm coupled to the first point of engagement and having its pivot coupled to the load, a second lever having a first arm coupled to the second point of engagement and having its pivot coupled to the load, and a coupling which couples a second arm of the first lever and a second arm of the second lever. These measures provide greater design freedom. For example, the connecting line between the points of engagement can thus be oriented parallel to the direction in which the load is positioned. This prevents the traction member from exerting a torque on the load. Moreover, this enables the coupling mechanism to be embedded more effectively in the available space.

An embodiment of the positioning device in accordance with the invention is characterized in that the tensioning means comprise urging means which subject the levers to a torque to urge the first point of engagement and the second point of engagement towards one another. Owing to these measures the couplings between the levers and the points of engagement and the pivots between the levers and the load are pretensioned, as a result of which there is no lost motion in the connection between the traction member and the load. This enables the load to be positioned accurately relative to the chassis.

An embodiment of the positioning device in accordance with the invention is characterized in that the coupling mechanism comprises by a diamond-shaped arrangement comprising a first element connected to a second element via a first pivot, a third element connected to the second element via a second pivot, a fourth element connected to the third element via a third pivot and to the first element via a fourth pivot, the coupling mechanism being connected to the first point of engagement near the first pivot and to the second point of engagement near the third pivot, and the coupling mechanism being coupled to the load near the second pivot and near the fourth pivot by means of linkage mechanisms which allow a movement of the second pivot and the fourth pivot, respectively, in a direction perpendicular to the direction in which the load is movable. This embodiment has the advantage that forces oriented perpendicularly to the direction in which the load is movable are not transmitted from the traction member to the load by the coupling mechanism. As a result of this, for example, bearing means that may have been provided for the load are loaded to a smaller extent and movements of the load in an undesired direction are precluded. Another advantage of these measures is that the first and the second point of engagement can perform a purely linear movement. This enables the forces exerted on the load to be maintained on the median of the load, as a result of which the traction member will not exert a torque on the load.

An embodiment of the positioning device in accordance with the invention is characterized in that the positioning device comprises a measuring device for converting the position of the load into a position signal, an electrically controlled motor which forms part of the drive means, and a control system adapted to control the motor on the basis of the difference between a reference signal, which represents a desired position, and the position signal. This embodiment enables the load to be positioned very accurately because the control system will correct any deviations between the desired position and the measured position by driving the motor. The bandwidth of the control system determines how fast and with what accuracy the desired position can be reached. The speed and the accuracy of the positioning device increase as the bandwidth is increased. However, the maximum possible bandwidth is limited by the lowest stiffness of the connection between the drive means and the load. Too large a bandwidth in relation to this stiffness will make the control system unstable and may cause this system to oscillate. As a matter of fact, the measures in accordance with the invention ensure that the minimum stiffness in the connection between the drive mechanism and the load is increased in comparison with the known system, thus enabling the bandwidth to be extended and the positioning accuracy and the speed to be increased. Moreover, the measures in accordance with the invention said stiffness can be rendered independent of the position of the load, as a result of which the positioning accuracy is independent of the position of the load.

The invention can be used advantageously in a component placement machine comprising a frame and a gripper for gripping and placing a component. The positioning device then serves for positioning the gripper relative to the frame. It is important, particularly in component placement machines for placing electronic components on a printed circuit board, that a load, i.e. in the present case a gripper, can be positioned with a high speed and a high accuracy. The comparatively large distances over which such a gripper is to be moved make a toothed-belt transmission an economically attractive option. The measures in accordance with the invention reduce the wear of the positioning device and at the same time enables a high positioning accuracy to be obtained.

These and other aspects of the invention will now be described in more detail, by way of example, with reference to the drawings, in which.

Figure 1:
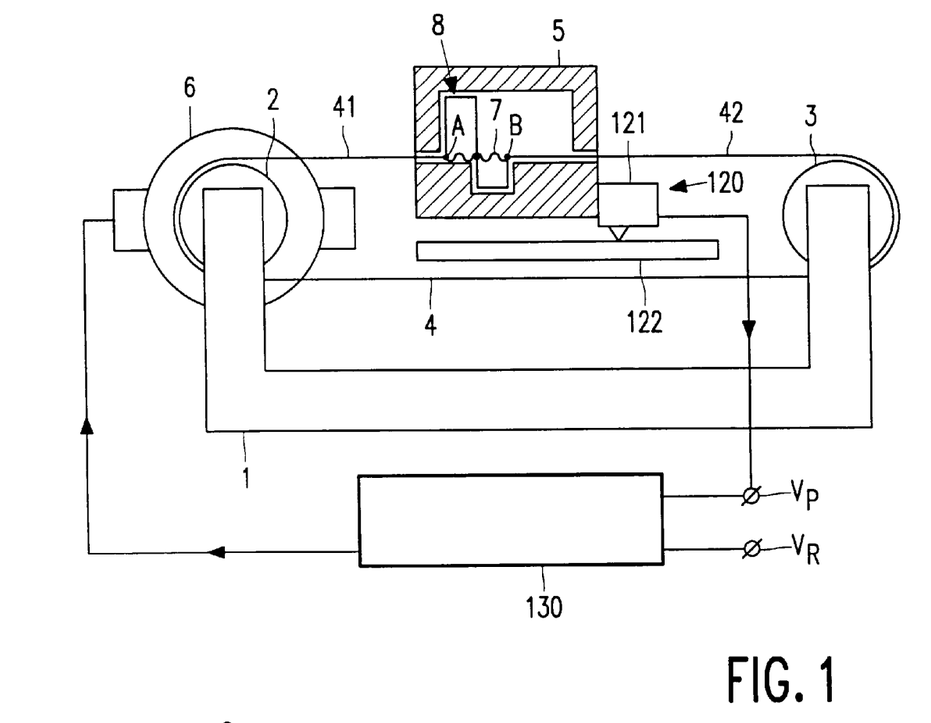
FIG. 1 shows diagrammatically a first embodiment of the positioning device in accordance with the invention.

FIG. 1 shows a first embodiment of the positioning device in accordance with the invention. The positioning device comprises a chassis 1 provided with at least two wheels, in the present case a drive wheel 2, mounted on the shaft of a motor 6, and a reversing wheel 3. The positioning device further comprises a loop-shaped traction member 4, for example a toothed belt or a chain, tensioned around the wheels 2 and 3. The positioning device further comprises a load 5 connected to the traction member 4, which load is movable relative to the chassis 1 and together with the traction member 4 forms a closed loop. The drive wheel 2 and the motor 6 form a drive means for driving the load 5 via a first section 41 of the traction member 4, which first section is disposed between the load 5 and the drive wheel 2, and via a second section 42 of the traction member 4, which second section is disposed between the load 5 and the drive wheel 2. The load 5 carries tensioning means for tensioning the traction member 4. These tensioning means, in the present case a helical spring 7, act on the first section 41 of the traction member 4 via a first point of engagement A and on the second section 42 of the traction member 4 via a second point of engagement B. This helical spring 7 keeps the traction member 4 under tension. The load 5 is coupled to the traction member 4 via a coupling mechanism 8. The coupling mechanism 8 links a first relative movement of the first point of engagement A relative to the load to a second relative movement of the point of engagement B relative to the load in an opposite direction. FIG. 1 further shows a measuring device 120 for converting the position of the load 5 relative to the chassis 1 into a position signal $V_p$. In the present case the measuring device 120 comprises an optical measuring head 121, connected to the load 5, and an optical rule 122, connected to the chassis 1. The position of the load 5 with respect to the chassis 1 can be determined accurately by means of this measuring device 120. Alternatively, the measuring device 120 may comprise, for example, an inductive or capacitive position sensor. The positioning device further includes a control system 130 adapted to control the motor 6 on the basis of the difference between a reference signal $V_r$, which represents a desired position, and the position signal $V_p$. By means of this positioning device the load 5 can be positioned very accurately with respect to the chassis 1, as described above.

Figure 2:
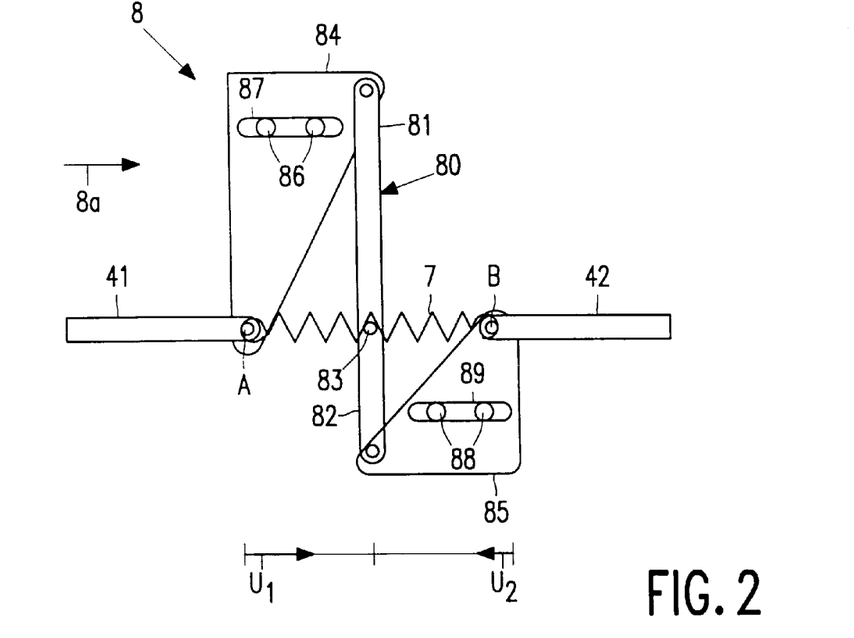
FIG. 2 shows a detail of the embodiment shown in FIG. 1.

FIG. 2 shows a detail of a first embodiment of the positioning device in accordance with the invention, showing the coupling mechanism 8 and the helical spring 7. The coupling mechanism 8 comprises a lever 80 having a first arm 81 coupled to the first point of engagement A via a first coupling plate 84. A second arm 82 of the lever 80 is coupled to the second point of engagement B via a second coupling plate 85. The first point of engagement A is connected to the first section 41 of the traction member 4 and the point of engagement B is connected to the second section 42 of the traction member 4 via a pivot. The lever 80 is coupled to the load 5 by its pivot, in the present case via a pivot 83 (see FIG. 1). The traction member 4 is coupled to the load 5 via the coupling mechanism 8 comprising the lever 80 and the coupling plates 84 and 85. In the present case the tensioning means are constituted by a helical spring 7 tensioned between the first point of engagement A and the second point of engagement B. The first coupling plate 84 is coupled to the load 5 by means of pins 86 secured to the load 5 and by means of a slot 87 in the coupling plate 84. The coupling plate 85 is also coupled to the load 5 by means of pins 88 connected to the load and by means of a slot 89 in the second coupling plate 85. This arrangement enables the coupling plates 84 and 85 to be moved exclusively in a direction parallel to the direction 8a in which the load 5 can be positioned. The coupling mechanism 8 links a first relative movement u1 of the first point of engagement A with respect to the load 5, in the present case corresponding to the pivot 83, to a second relative movement $u_2$ of the second point of engagement B relative to the pivot 83.

Figure 3:
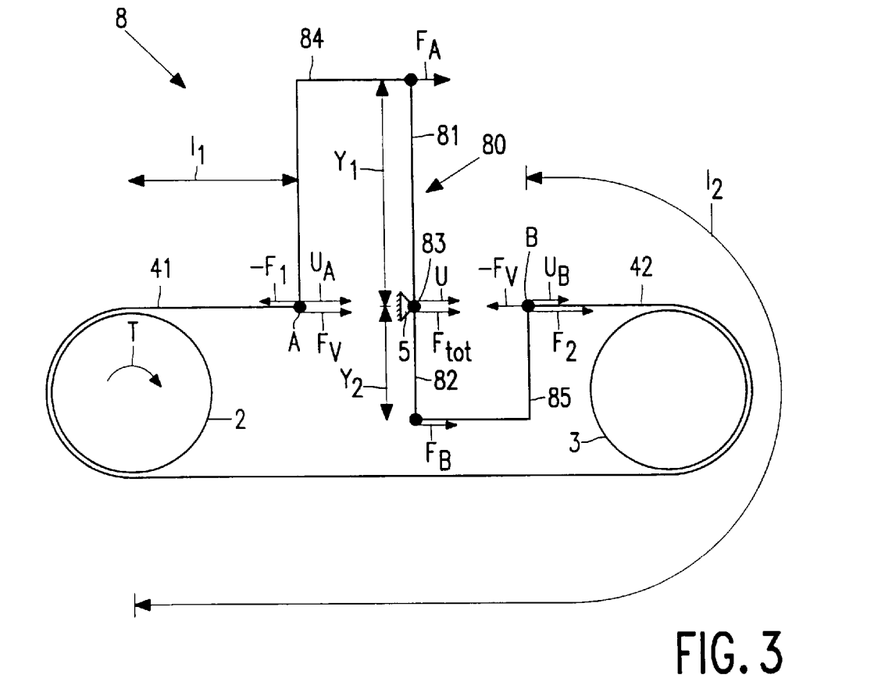
FIG. 3 is a simplified representation of the first embodiment, which diagrammatically show the forces and movements.

FIG. 3 is a simplified representation of the first embodiment of the positioning device in accordance with the invention, representing forces and movements. The helical spring 7 shown in FIGS. 1 and 2 produces a pretensioning force $F_v$ in the traction member 4. When the motor 6 shown in FIG. 1 is energized a torque T is exerted on the drive wheel 2. As a result, the tensioning force $F_1$. prevailing in the first section 41, $I_1$ of the traction member 4 is reduced by a force having a magnitude $F_A$. The tensioning force $F_2$ prevailing in the second section 42, $I_2$ of the traction member 4 is increased by a force having a magnitude $F_B$. The forces $F_A$ and $F_B$ result in an overall force $F_{tot}$, which is exerted on the load 5 via the pivot 83. The movement of the first point of engagement A with respect to the drive wheel 2 bears the reference $U_A$. The movement of the second point of engagement B relative to the drive wheel 2 bears the reference $u_B$. The movement of the pivot 83 with respect to the drive wheel 2 is referenced $u_A$. The length of the first arm 81 of the lever 80 is $y_1$. The length of the second arm 82 of the lever 80 is $Y_2$. How the measures in accordance with the invention lead to reduction of the tensioning forces $F_1$, and $F_2$ and how the measures in accordance with the invention lead to an increase of the stiffness of the connection between the drive wheel 2 and the load 5 will be set forth hereinafter.

Owing to the measures in accordance with the invention the following holds:

$$u - u_B = i \cdot (u_A - u), \text{ or}$$

$$u = (i \cdot u_A + u_B)/(i+1), \text{ where} \tag{1}$$

$$i = y_2/y_1$$

in which i is the transmission ratio between the first relative movement $u_A - u$ and the second relative movement $u - u_B$.

The driving force $F_{tot}$ is transmitted to the load 5 via the first point of engagement A and the second point of engagement B, so that the following holds:

$$F_{tot} = F_A + F_B \tag{2}$$

where $F_A$ and $F_B$ are the forces exerted on the coupling mechanism 8.

Since the sum of the torques in the lever 80 is zero, it holds that:

$$F_A \cdot y_1 = F_B \cdot y_2 \text{ or}$$

$$F_A = i \cdot F_B, \tag{3}$$

Combining equations (2) and (3) yields:

$$F_A = F_{tot} \cdot i/(i+1) \text{ and} \tag{4}$$

$$F_B = F_{tot} \cdot 1/(i+1). \tag{5}$$

From FIG. 3 it can simply be derived that:

$$F_1 = F_v - F_A$$

$$F_2 = F_v + F_B$$

where $F_1$ is the tensioning force in the first section 41 of the traction member 4, $F_2$ is the tensioning force in the second section 42 of the traction member 4, and $F_v$ is the pretensioning force exerted on the traction member 4 by the helical spring 7.

In order ensure that always a minimum tensioning force $F_{min}$ in is sustained in the traction member it is necessary to comply with:

$$F_v = max(F_A, F_B) + F_{min}$$

so that the maximum tensioning force $F_{max}$ in the traction member 4 is given by $$F_{max} = F_v + max(F_A, F_B) = 2 \cdot max(F_A, F_B) + F_{min}$$

Figure 4:
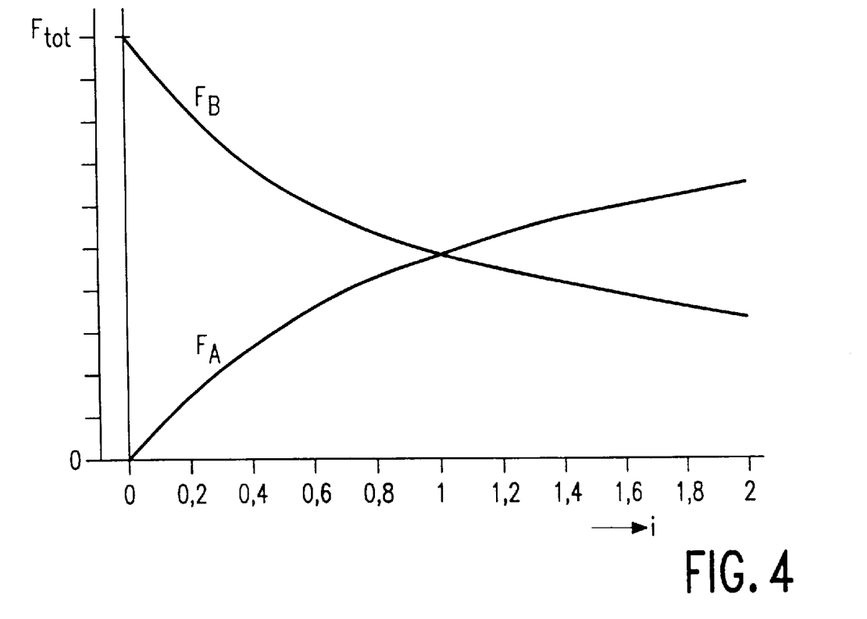
FIG. 4 shows two forces in the first embodiment as a function of a transmission ratio of a coupling mechanism.

FIG. 4 shows how the forces $F_A$ and $F_B$ depend on the selected transmission ratio i. The known positioning device corresponds to the transmission ratio i=0. From FIG. 4 it is apparent that if i is selected between 0.5 and 2, the maximum tensioning force $F_{max}$ is reduced to approximately two thirds of the maximum tensioning force in the known device. If i is selected to lie between 0.8 and 1.25 it even appears that the maximum tensioning force $F_{max}$ is reduced to 55% of the maximum tensioning force that occurs in the known device. The minimum tensioning force $F_{min}$ is selected in such a manner that $F_{min} << F_{max}$.

Figure 5:
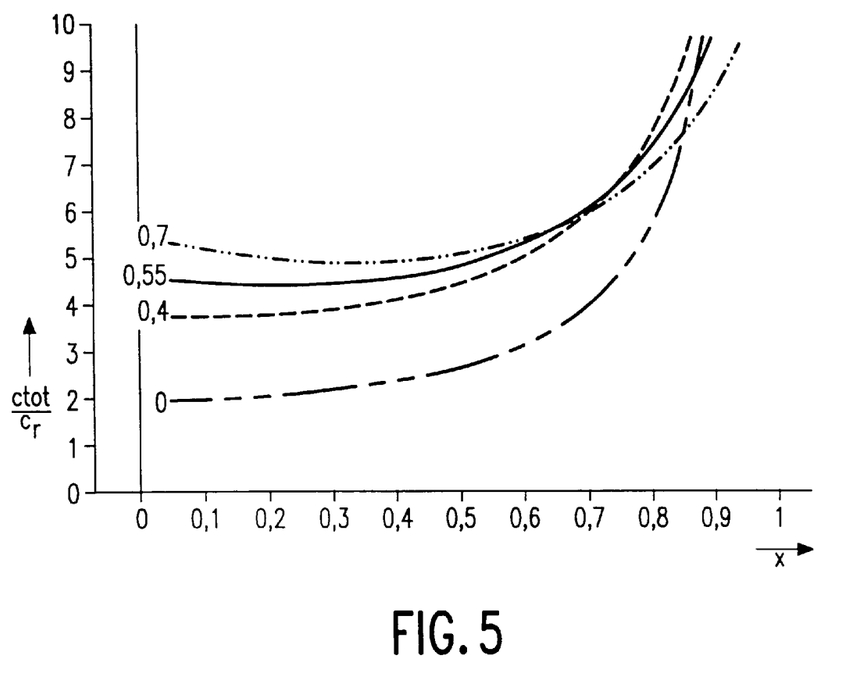
FIG. 5 shows a relative stiffness of the connection of the drive mechanism to the load as a function of the position of the load for different values of the transmission ratio of the coupling mechanism in the case of a first effective stiffness of the tensioning means.

FIG. 5 shows how the stiffness of the connection between the drive means and the load depends on the position of the load with respect to the drive means for different ratios between the first and the second relative movements. The stiffness $c_{tot}$ of the connection between the drive wheel 2 and the load 5 is defined as:

$$c_{tot} = F_{tot}/u, \qquad (6)$$

where u is the relative movement of the load 5 with respect to the drive wheel owing to the force $F_{tot}$ and the finite stiffness of the helical spring 7 and the traction member 4.

Similarly to equation (6), the following holds $$u_A = F_A/c_A \text{ and} \qquad (7)$$

$$u_B = F_B/c_B \text{ and} \qquad (8)$$

where $c_A$ is the stiffness of the connection between the drive wheel 2 and the first point of engagement A and $c_B$ is the stiffness of the connection between the drive wheel 2 and the second point of engagement B.

Substitution of equations (4), (5), (7) and (8) in (6) yields $$c_{tot} = (i+1)^2 \cdot c_A \cdot c_B / (c_A + i^2 \cdot c_B)) \qquad (9)$$

Since the points of engagement A and B are pretensioned relative to one another by means of the helical spring 7 having an effective stiffness $c_3$ with respect to the points of engagement A and B, the following holds:

$$c_A = c_1 + c_2 \cdot c_3/(c_2 + c_3) \text{ and} \qquad (10)$$

$$c_B = c_2 + c_1 \cdot c_3/(c_1 + c_3), \qquad (11)$$

where $c_1$ is the stiffness of the first section 41 of the traction member 4 and $c_2$ is the stiffness of the second section 42 of the traction member 4. Moreover, the following holds:

$$c_1 = c_r \cdot l/l_1 \text{ and } c_2 = c_r \cdot l/l^2 \qquad (12)$$

where l is the length of the traction member 4, $l_1$ is the length of the first section 41 of the traction member 4, $l_2$ is the length of the second section 42 of the traction member (see FIG. 3), and $c_r$ is the stiffness of the traction member 4 measured over its whole length l.

Depending on the position of the load 5 relative to the drive wheel 2 the length $l_1$ of the first section 41 will vary and so will the length $l_2$ of the second section, for which the following approximation holds:

$$l_1 = x \cdot l \text{ and } l_2 = (1-x) \cdot l, \qquad (13)$$

where x is a measure of the relative position of the load 5 with respect to the total length 1 of the traction member 4. The stiffnesses $c_1$ and $c_2$ vary depending on the position of the load 5 relative to the drive wheel 2:

$$c_1 = c_r/x \text{ and } c_2 = c_r/(1-x) \qquad (14)$$

FIG. 5 represents the ratio $c_{tot}/c_r$ as a function of x for different values of i, in the case that $c_3 = c_r$. The known positioning device corresponds to the transmission ratio i=0. It is apparent from FIG. 5 that by means of the measures in accordance with the invention the minimum stiffness of the connection between the drive means 2 and the load 5 is several times as great as that of the known device. The effective range of the positioning device as shown in FIG. 1 is approximately given by 0.1<x<0.4. If 0.4<i<0.7 the stiffness $c_{tot}$ in this effective range is found to be substantially constant.

Figure 6:
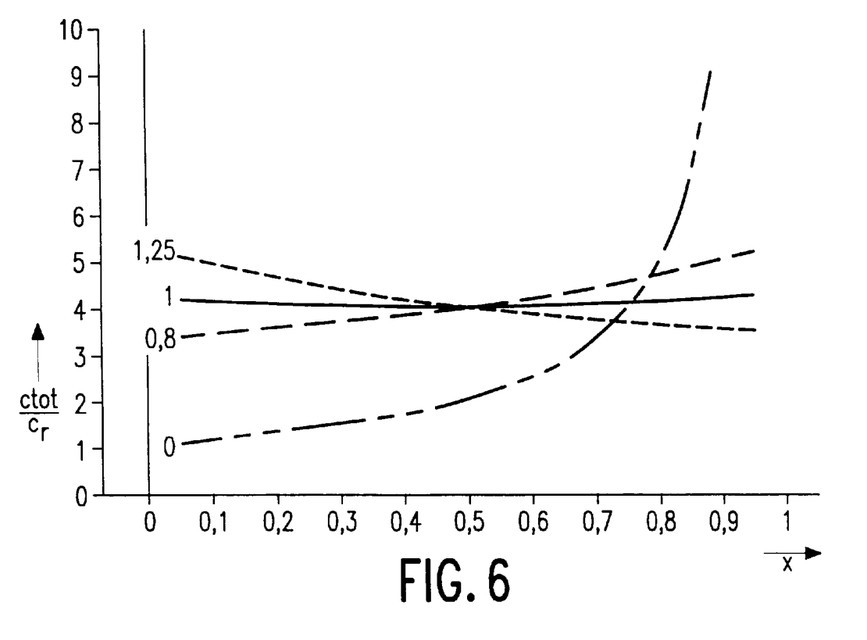
FIG. 6 is a representation similar to that of FIG. 5 in the case that the tensioning means have a second effective stiffness.

FIG. 6 represents the ratio $c_{tot}/c_r$ as a function of x for different values of i, in the case that $c_3 = 0.1 c_r$. Despite the comparatively low stiffness $c_3$ of the helical spring 7 the stiffness $c_{tot}$ of the connection between the drive wheel 2 and the load 5 yet appears to be several times as high as the stiffness $c_r$ of the traction member 4. Moreover, it appears that the stiffness $c_{tot}$, is substantially independent of the relative position x of the load 5 if 0.8<i<1.25.

Figure 7:
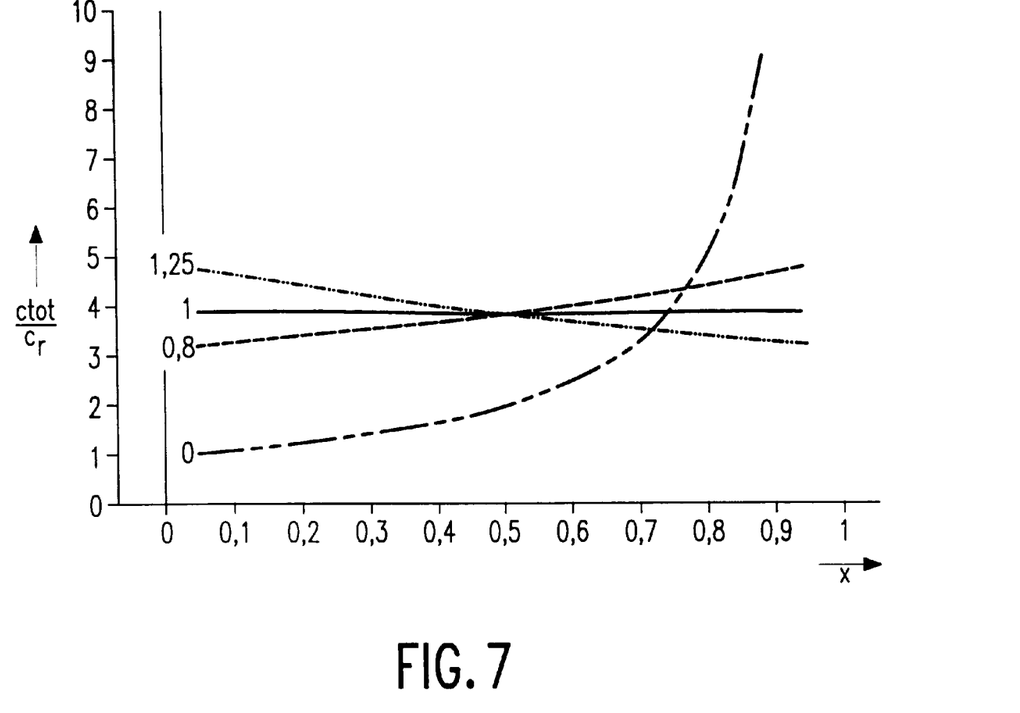
FIG. 7 is a representation similar to that of FIGS. 5 and 6 in the case that the tensioning means have a third effective stiffness.

FIG. 7 represents the ratio $c_{tot}/c_r$ as a function of x for different values of i, in the case that $c_3 = 0.01 c_r$. From this FIG. its is apparent that it is possible to select the stiffness $c_3$ of the helical spring 7 to be very small and even zero without this having much influence on the stiffness $c_{tot}$. A very low stiffness $c_3$ has the advantage that temperature variations hardly affect the tensioning force $F_v$ in the traction member.

Figure 8:
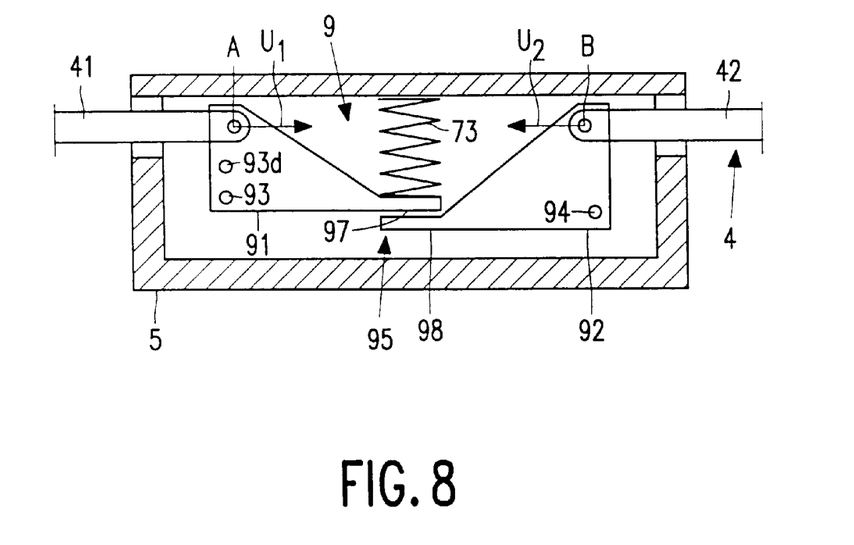
FIG. 8 shows a detail of a second embodiment of the positioning device in accordance with the invention.

FIG. 8 shows a detail of a second embodiment of the positioning device in accordance with the invention. FIG. shows a coupling mechanism 9 comprising a first lever 91 which couples the first point of engagement A to the load 5 via a pivot 93. The coupling mechanism 9 further comprises a second lever which couples the second point of engagement B to the load 5 via a second pivot 94. A coupling 95 links the movements of the first lever 91 and the second lever 92. The coupling 95 comprises a part 97 of the first lever 91, a part 98 of the second lever 92, which parts engage with one another, and a spring 73, which in conjunction with the traction member 4 ensures that the parts 97 and 98 remain in engagement with one another. The spring 73 is tensioned between the load 5 and the part 97 of the first lever 91. Since the connecting line between the parts 97 and the pivot 93 extends perpendicularly to the connecting line between the first point of engagement A and the pivot 93, the spring 73 exerts a tensioning force on the first section 41 of the traction member 4. This tensioning force results in a similar tensioning force on the second section 42 of the traction member. As a result, this second section 42 of the traction member 4 exerts a force on the second lever 92 via the second point of engagement B, which force ensures that the second part 98 of the second lever 92 remains in engagement against the part 97 of the first lever. The coupling mechanism 9 links a first relative movement $u_1$ of the first point of engagement A with respect to the load 5 to a second relative movement $u_2$ of the second point of engagement B with respect to the load 5. For the proportions as shown in FIG. 8 $u_1$ and $u_2$ are equal to one another an oppositely directed. By allowing for example the first pivot 91 to pivot relative to the load 5 by means of a pivot $93_a$. Instead of the pivot 93, the coupling mechanism 9 can be adapted in such a manner that $u_2$ will be twice as large as $u_1$. By means of this second embodiment of the positioning device in accordance with the invention it is also possible to select the transmission ratio i between the first relative movement $u_1$ and the second relative movement $u_2$.

Together with the coupling mechanism 9 the spring 73 forms tensioning means which tension the traction member 4. The effective stiffness of these tensioning means between the first point of engagement A and the second point of engagement B is then determined by the spring stiffness of the spring 73 and the transmission ratios between a movement of the parts 97 and 98 and the movements of the first point of engagement A and the second point of engagement B in a manner which is obvious to an expert. The principal advantage of this second embodiment of the positioning device in accordance with the invention is that it comprises a small number of parts. In addition, the construction can be robust, so that it can handle substantial forces.

Figure 9:
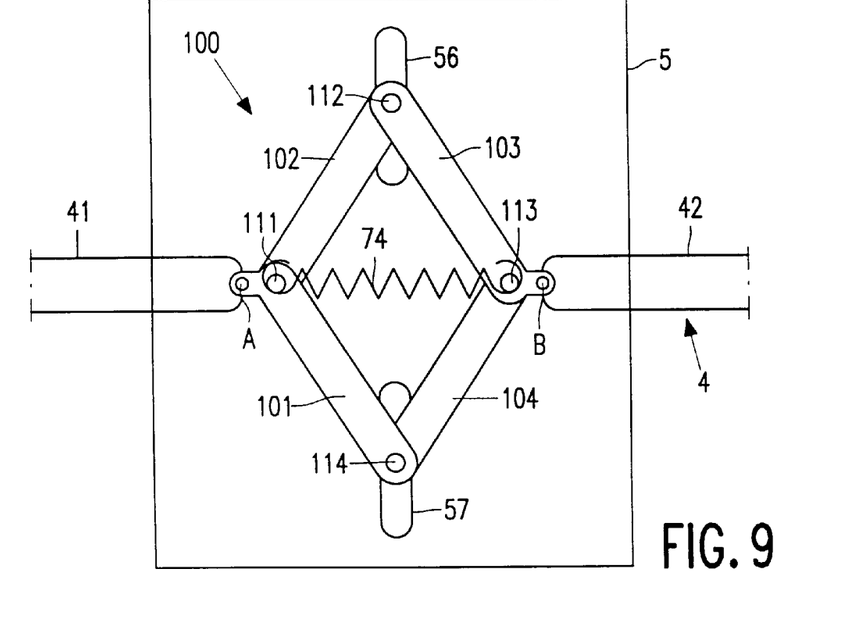
FIG. 9 shows a detail of a third embodiment of the positioning device in accordance with the invention.

FIG. 9 shows a detail of a third embodiment of the positioning device in accordance with the invention. In this third embodiment the coupling mechanism, which couples the first section 41 of the traction member 4 and the second section 42 of the traction member 4 to the load 5, is constituted by a diamond-shaped arrangement 100. The diamond-shaped arrangement 100 comprises a first element 101, which is connected to a second element 102 via a pivot 111. The diamond-shaped arrangement 100 further comprises a third element 103, which is connected to the second element 102 via a second pivot 112, and a fourth element 104, which is connected to the third element via a third pivot 113. The third element 113 is connected to the first element 101 via a fourth pivot 114. The second element 102 and the third element 103 are slidably coupled to the load 5 at the location of the second pivot 112 in that a pin of the pivot 112 engages a slot 56 in the load 5. The first element 101 and fourth element 104 are slidably coupled to the load 5 at the location of the fourth pivot 114 in that a pin of the pivot 114 engages a slot 57 in the load 5. This diamond-shaped arrangement 100 ensures that a relative movement of the first pivot 111 with respect to the load 5 results in a second relative movement of the third pivot 113 with respect to the load 5, which is equal but oppositely directed. By coupling the first section 41 of the traction member 4 via a first point of engagement A near the first pivot 111 and connecting the second section 42 of the traction member 4 via a second point of engagement B near the third pivot 113 a positioning device in accordance with the invention is obtained. In this third embodiment a tension spring 74 is tensioned between the first pivot 111 and the third pivot 113. However, as an alternative, it is possible to implement tensioning means for pretensioning the traction member 4 by tensioning a tension spring between the second pivot 112 and the load 5. It is likewise possible to pretension the traction member 4 by means of a helical spring which acts on the second pivot 112 and the fourth pivot 114 in such a manner that these two pivots are urged away from one another.

Figure 10:
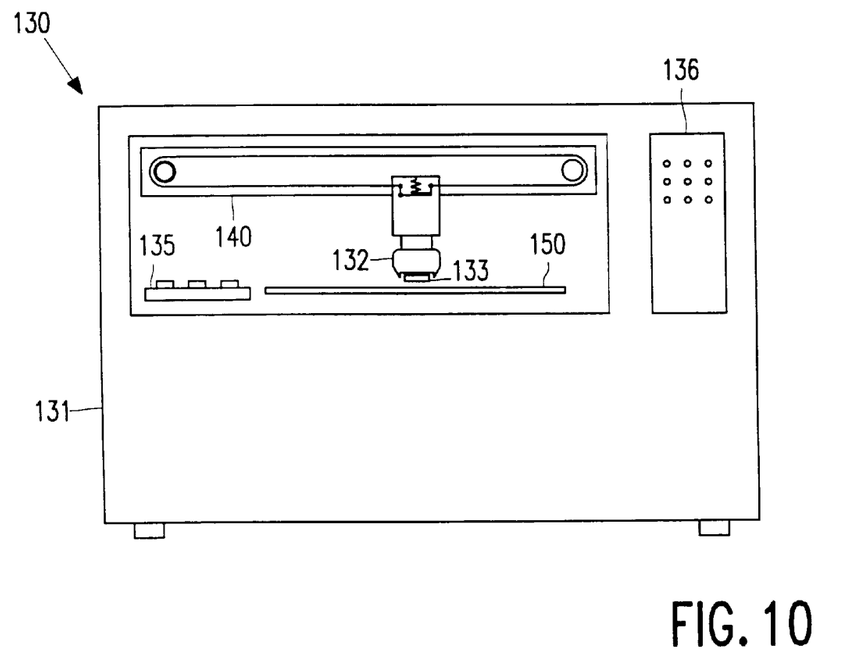
FIG. 10 shows a component placement machine including a positioning device in accordance with the invention.

FIG. 10 shows a component placement machine including a positioning device in accordance with the invention. The component placement machine 130 comprises a frame 131 and a gripper 132 for gripping and positioning a component 133. The gripper 132 is connected to the frame 131 via a positioning device 140. By means of the component placement machine 130 it is possible to grip components from a carrier 135 with the aid of a gripper 132 to place them onto a printed circuit board 150. The component placement machine 130 further comprises an electronic control unit 136 which controls the positioning device 140 and the gripper 132 in such a manner that a multitude of components 133 can be mounted on the printed circuit board 150 in succession. The positioning device 140 is a positioning device in accordance with the invention. This results in a component placement machine 130 with a high positioning accuracy and speed at comparatively low cost.

It is to be noted that the invention is not limited to positioning devices comprising coupling mechanisms based on levers. For example, the coupling mechanism may utilize a construction with two toothed racks and toothed wheels which are journaled with respect to the load and which couple the movements of the toothed racks, each of the toothed racks being connected to a point of engagement.

We claim:
1. A positioning device comprising
 a chassis (1) provided with at least two wheels (2, 3),
 a loop-shaped traction member (4) tensioned around the wheels,
 a load (5) connected to the traction member, which load is movable relative to the chassis and together with the traction member forms a closed loop,
 a drive means (6) for driving the load via a first section of the traction member, which first section is disposed between the load and the drive means, and via a second section of the traction member, which second section is disposed between the load and the drive means, tensioning means (7), connected to the load, for tensioning the traction member,
which tensioning means act on the first section (41) of the traction member via a first point of engagement (A) and on the second section (42) of the traction member via a second point of engagement (B),
characterized in that the connection between the load (5) and the traction member (4) includes a coupling mechanism (8; 9; 100), by means of which a first relative movement ($u_1$; $u_A$-u) of the first point of engagement (A) relative to the load in a first direction (8a) is linked to a second relative movement ($u_2$; u-$u_B$) of the point of engagement (B) relative to the load in a direction opposite to the first direction.

2. A positioning device as claimed in claim 1, characterized in that the coupling mechanism (8; 9; 100) has a transmission ratio, symbolized by a variable i, between the first relative movement ($u_1$; $u_A$-u) and the second relative movement ($u_2$; u-$u_B$), which ratio is between 0.5 and 2.

3. A positioning device as claimed in claim 2, characterized in that $0.8<i<1.25$.

4. A positioning device as claimed in claim 1, characterized in that the tensioning means (7) have an effective first stiffness ($c_3$) with respect to the points of engagement (A, B) and the traction member (4) has a second stiffness ($c_r$) between the points of engagement (A, B), and the second stiffness is not more than one tenth of the first stiffness.

5. A positioning device as claimed in claim 1, characterized in that the second stiffness ($c_r$) is not more than one hundredth of the first stiffness ($c_3$).

6. A positioning device as claimed in claim 1, characterized in that the coupling mechanism (8) comprises a lever (80) having a first arm (81) coupled to the first point of engagement (A) and having second arm (82) coupled to the second point of engagement (B), and the pivot (83) of the lever is coupled to the load (5).

7. A positioning device as claimed in claim 6, characterized in that the tensioning means (7) comprise urging means (73) which subject the levers (91) to a torque to urge the first point of engagement (A) and the second point of engagement (B) towards one another.

8. A positioning device as claimed in claim 1, characterized in that the coupling mechanism (9) comprises a first lever (91) having a first arm coupled to the first point of engagement (A) and having its pivot (93) coupled to the load (5), a second lever (2) having a first arm coupled to the second point of engagement (B) and having its pivot (94) coupled to the load, and a coupling (95) which couples a second arm of the first lever and a second arm of the second lever.

9. A positioning device as claimed in claim 1, characterized in that the coupling mechanism comprises by a diamond-shaped arrangement (10) comprising a first element (101) connected to a second element (102) via a first pivot (111), a third element (103) connected to the second element via a second pivot (112), a fourth element (104) connected to the third element via a third pivot (113) and to the first element via a fourth pivot (114), the coupling mechanism being connected to the first point of engagement (A) near the first pivot and to the second point of engagement (B) near the third pivot, and the coupling mechanism being coupled to the load (5) near the second pivot and near the fourth pivot by means of linkage mechanisms which allow a movement of the second pivot and the fourth pivot, respectively, in a direction perpendicular to the direction in which the load is movable.

10. A positioning device as claimed in claim 1, characterized in that the positioning device comprises a measuring device (120) for converting the position of the load into a position signal ($V_p$), an electrically controlled motor (6) which forms part of the drive means, and a control system (130) adapted to control the motor on the basis of the difference between a reference signal ($V_r$), which represents a desired position, and the position signal.

11. A component placement machine (130) comprising a frame (131) and a gripper (132) for gripping and placing a component (133), and a positioning device (140) as claimed in claim 1, for positioning the gripper relative to the frame.

12. Apparatus comprising:

a chassis (1) including at least two wheels (2,3);

a loop-shaped traction member (4) tensioned around the wheels;

a load (5) connected to the traction member, which load is movable relative to the chassis and together with the traction member forms a closed loop;

drive means (6) for driving the load via first and second sections of the traction member, the first section being at least part of a first path ($I_1$) between the drive means and the load, the second section being at least part of a second path ($I_2$) between the load and the drive means;

tensioning means, connected to the load, for tensioning the traction member, which tensioning means acts on the first section (41) via a first point of engagement (A) and on the second section (42) via a second point of engagement (B);

a coupling mechanism for linking first and second relative motions, the first relative motion being of the first point of engagement relative to the load, the second relative motion being of the second point of engagement relative to the load, the first and the second relative motions being in opposite directions.

* * * * *